United States Patent [19]

Yang

[11] Patent Number: 5,396,377
[45] Date of Patent: Mar. 7, 1995

[54] DEVICE FOR CONVERTING DATA FROM SERIES TO PARALLEL

[75] Inventor: Tae S. Yang, Seoul, Rep. of Korea

[73] Assignee: Goldstar Co., Ltd., Seoul, Rep. of Korea

[21] Appl. No.: 121,480

[22] Filed: Sep. 16, 1993

[30] Foreign Application Priority Data

Sep. 16, 1992 [KR] Rep. of Korea ............... 1992-16841

[51] Int. Cl.⁶ ............................................. G11B 05/09
[52] U.S. Cl. ......................................... 360/51; 360/32
[58] Field of Search ....................... 360/48, 53, 51, 32; 369/59, 53; 371/30

[56] References Cited

U.S. PATENT DOCUMENTS

| | | | |
|---|---|---|---|
| Re. 33,665 | 8/1991 | Ogawa | 369/33 |
| 4,275,421 | 1/1981 | Louie etal. | 358/183 |
| 4,530,048 | 7/1985 | Proper | 360/32 |
| 4,651,232 | 3/1987 | Lemoine et al. | 360/9.1 |
| 4,868,922 | 9/1989 | Tsuji et al. | 360/53 X |

*Primary Examiner*—Donald Hajec
*Assistant Examiner*—Le, Thien Minh
*Attorney, Agent, or Firm*—Morgan & Finnegan

[57] ABSTRACT

This invention relates to a device for correct converting of continuously reproduced serial data to original parallel data by detecting a synchronous signal, including a shift register for delaying serial data by a number of bits of a synchronous signal pattern in accordance with a serial clock, the serial data being reproduced from a magnetic recording medium, a detector for detecting a synchronous signal from an output signal of the shift register, a system controller for generating a predetermined bits interval of a parallel load signal and a parallel clock signal from the synchronous signal in accordance with the serial clock, a parallel shift register for converting the output signal of the shift register to a predetermined bits interval of parallel data in accordance with the parallel load signal, and counter part for counting the parallel clock signal to generate window signals detecting the synchronous signal in a certain period when the detector detects the synchronous signal.

8 Claims, 3 Drawing Sheets

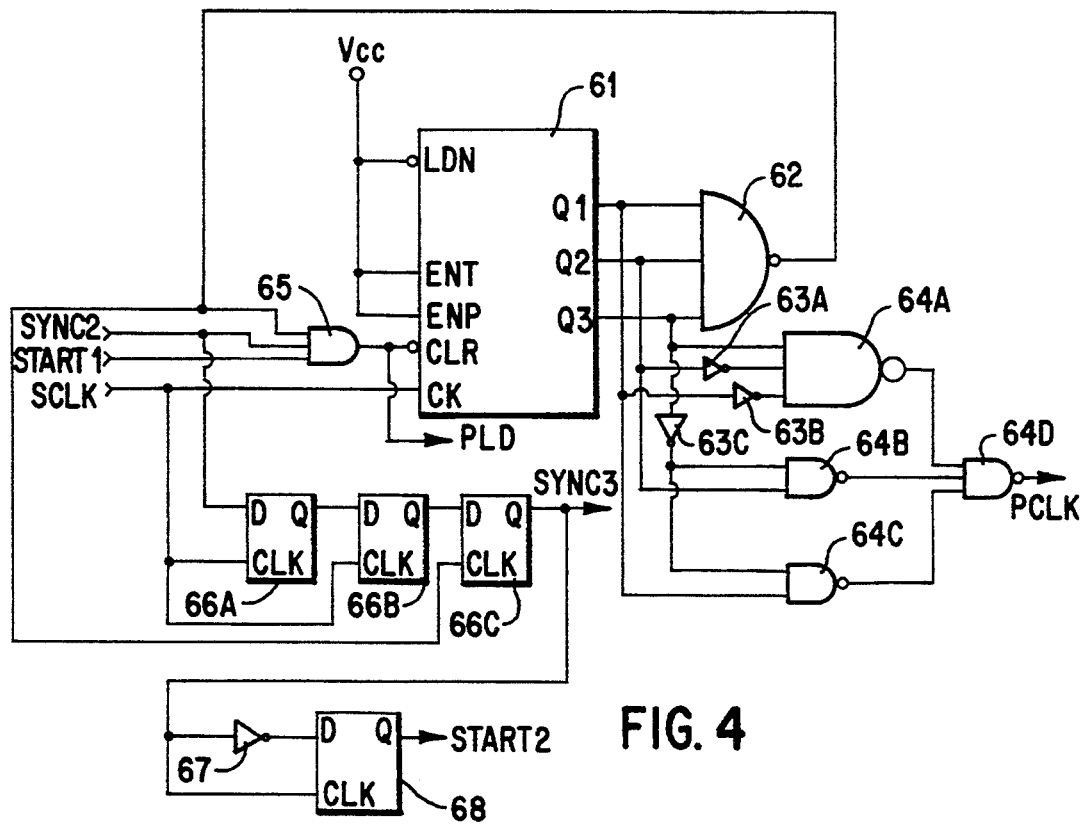
FIG. 4
FIG.5(A) SYNC2
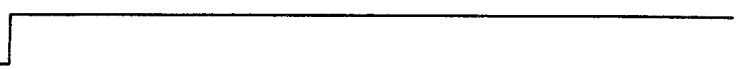
FIG.5(B) START1
FIG.5(C) PCLK
FIG.5(D) PLD
FIG.5(E) SYNC3
FIG.5(F) START2

DEVICE FOR CONVERTING DATA FROM SERIES TO PARALLEL

FIELD OF THE INVENTION

This invention relates to devices for converting data used in a video cassette recorder(VCR) and the like, more particularly to devices for correct converting of continuously reproduced serial data to original parallel data by detecting a synchronous signal.

BACKGROUND OF THE INVENTION

In general, magnetic recording devices like a digital VCR process data in parallel. In recording, the parallel data are converted to serial data after providing with synchronous signals. In reproduction, the serial data is converted to parallel data, when the continuously reproduced serial data is required to be converted to parallel data on time in order to obtain the exact original parallel data from the converted serial data. If the converting time were mismatched, the converted parallel data will be different with the original data. For example, if the serial data were converted to parallel data one clock earlier, the least significant bit of the converted data become the most significant bit of the next parallel data. Because the matching of converting time is very important as explained above, the synchronous signal having been provided on recording are detected to use as a basis.

Shown in FIG. 1 is a block diagram for conventional device for converting data from series to parallel. The device includes a shift register 10 for shifting the input serial data as many as the number of bits of the synchronous signal patterns according to the serial clock, a synchronous signal detector 20 for detecting synchronous signal from signals by means of logical combination of output signals of the shift register 10, parallel data clock generator 30 for generating base signals being pulses in 8-bit interval and the parallel data clock according to the synchronous signal detected at the synchronous signal detector 20, and parallel shift register 40 for converting the output from the shift register 10 to parallel data according to the base signals generated in the parallel data clock generator 30.

The device for converting data from series to parallel shown in FIG. 1 employs a 16 bit shift register 10 to detect 16 bit synchronous signal. In general, in recording of data on tape, data are recorded in synchronous block units, and one synchronous block includes 100 8-bit parallel data as shown in FIG. 2(A), two of which have two synchronous signal pattern(16-bit) while the rest 98 have data pattern.

The 16-bit shift register 10 shifts the serial data reproduced continuously from magnetic tape (not shown) according to the serial data clock, the synchronous signal detector 20 detects synchronous signal by means of logical combination of the shifted output Q1 to Q16 of the shift register 10, the parallel data clock generator 30 generates the parallel clock required in processing the parallel data and pulses in 8-bit interval, by actuating a 3-bit counter (not shown) in the parallel data clock generator 30 according to the detected synchronous signal and the parallel shift register 40 converts the output of the shift register 10 to 8-bit parallel data according to the pulses of 8-bit interval. The 8-bit parallel data are generated continuously form the first detection of the synchronous signal to the next detection of the signal.

However, it has happened in such conventional circuits cases when correct signals could not be detected due to the damage of tape, the deterioration of signals from prolonged use and the instability of the mechanism. For example, burst errors caused by damage of tape may cause the intervals between synchronous signals to change or the patterns disturbed, and random error also may cause the pattern of the synchronous signal disturbed or other non-synchronous signals to enter as synchronous signals. According to the tape recording pattern as shown in FIG. 2(B), each tracks T1, T2 and T3 has 200 synchronous blocks recorded thereon as shown in FIG. 2(B), for which a few heads in VCR read in the signal thereon running on each tracks one by one alternatively. But cases may happen when an error in any synchronous block due to an mechanical error at the moment of the head alternation may disturb signal patterns and change clock. Especially the starting part and the ending part of the tracks is susceptible to error development in have high probability. Accordingly in cases when correct synchronous signals can not be detected, the time to convert data to parallel will be mismatched to cause the problem of the parallel data obtained through this process being different with the original data.

SUMMARY OF THE INVENTION

The object of this invention is to provide devices for converting data form series to parallel which is capable of obtaining correct original data through correct detection of synchronous signals.

This and other objects of this invention can be achieved by providing a device for converting data from series to parallel, comprising:

a shift register for delaying serial data by a number of bits of a synchronous signal pattern in accordance with a serial clock, the serial data being reproduced from a magnetic recording medium;

a detector for detecting a synchronous signal from an output signal of the shift register;

a system controller for generating a predetermined bits interval of a parallel load signal and a parallel clock signal from the synchronous signal in accordance with the serial clock;

a parallel shift register for converting the output signal of the shift register to a predetermined bits interval of parallel data in accordance with the parallel load signal; and counter part for counting the parallel clock signal to generate window signals detecting the synchronous signal in a certain period when the detector detects the synchronous signal.

BRIEF DESCRIPTION OF THE DRAWINGS

FIGS. 2(A), 2(B) and 2(C) show patterns of data recorded in a tape, wherein

FIG. 2(A) shows synchronous block pattern,

FIG. 2(B) shows recording pattern in a tape and,

FIG. 2(C) shows pattern of data recorded in a track.

FIG. 4 is detail of the system controller shown in FIG. 3.

FIGS. 5(A) to 5(F) show wave patterns of input and output of the parts in FIG. 3.

DETAILED DESCRIPTION OF THE INVENTION

Figure 3:
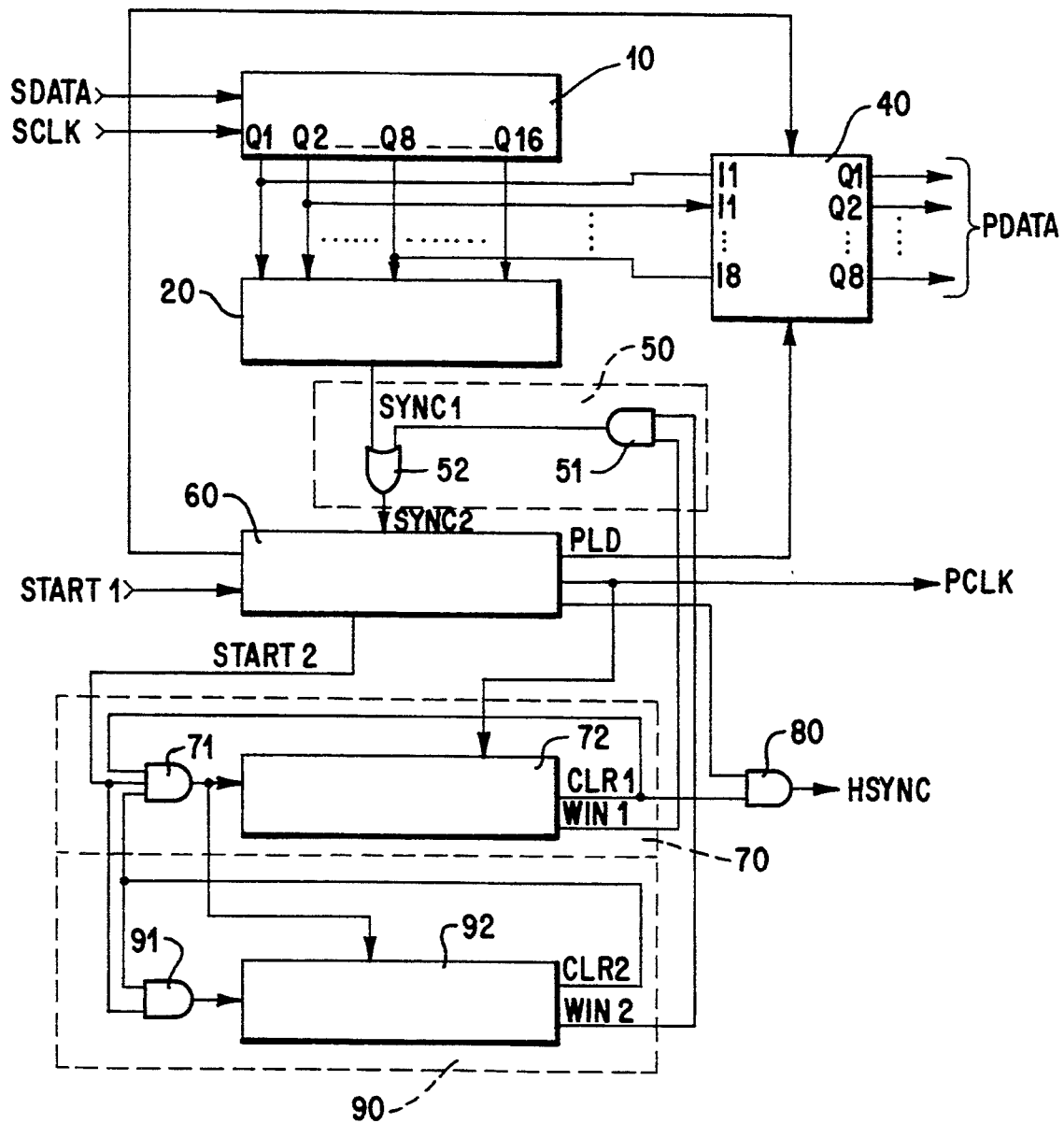
FIG. 3 shows a block diagram of a devices for converting data from series to parallel in accordance with this invention.

FIG. 3 shows a block diagram of a device for converting data from series to parallel in accordance with this invention which includes a shift register 10 for shifting input serial data SD as many as the number of bits of synchronous signal patterns, a synchronous signal detector 20 for detecting the synchronous signal SYNC1 by logical combination of the output of the shift register 10, a detection window controller 50 having AND gate 51 and OR gate 52, for controlling to generate synchronous signal SYNC2 for preset intervals by logical operation of the synchronous signal SYNC1 detected in the synchronous signal detector 20 in combination with window signals WIN1, WIN2, as shown in FIG. 5(A), a system controller 60 for controlling to generate parallel load signal PLD as in FIG. 5(F), parallel clock signal PCLK as in FIG.(C), synchronous signal SYNC3 of parallel time as in FIG. 5(E) and start signal START2 as in FIG. 5(F) according to start signal START1 and synchronous signal SYNC2 as in FIG. 5(B), parallel shift register 40 for converting the output data of the shift register 10 to parallel data PDATA according to the parallel load signal PLD of the system controller 60, first counter part 70 having an AND gate 71 and a counter 72, for generating horizontal clock signal HCLK, window signal WIN1 and clear signal CLR1 according to the parallel clock signal PCLK and the start signal START2 of the system controller 60, an AND gate 80 for producing horizontal synchronous signal HSYNC by the logical product of the synchronous signal SYNC3 of the parallel time of the system controller 60 with the clear signal CLR1 of the first counter 70, and second counter 90 having an AND gate 91 and a counter 92, for generating clear signal CLR2 and detection window signal WIN2, according to the start signal START2 of the controller 60 and the horizontal clock signal HCLK of the first counter 90.

The clear signal CLR1 is signal to generate the synchronous signal when the synchronous patterns are disturbed while clear signal CLR2 are signal to generate synchronous signal at the head alternation parts.

As shown in FIG. 4, the system controller 60 includes a counter 61 for counting a serial clock signal SCLK, a NAND gate 62 for performing NAND operation of the output Q1, Q2 and Q3 of the counter 61 and generating "0" in 8-bit interval, inverters 63A, 63B and 63C, NAND gates 64A through 64D, for generating the parallel clock signal PCLK as shown in FIG. 5(C) through logical operation of the counter 61 output, an AND gate 65 for generating the parallel load signal PLD through the logical operation of the NAND gate 62 output, the synchronous signal SYNC2 as shown in FIG. 4(A) and the start signal START1 as shown in FIG. 5(B), D flip-flops 66A, 66B and 66C for generating the synchronous signal SYNC3 of the parallel time as shown in FIG. 5(E) by shifting the synchronous signal SYNC2 as shown in FIG. 5(A) for preset time, and an inverter 67 and a D flip-flop 68 for generating the start signal START2 by inverting and shifting the output signal SYNC3 of the D flip-flop 66C.

The operation and the effect of aftermentioned devices for converting data from series to parallel in accordance with one embodiment of this invention will be explained hereinafter.

When data is continuously reproduced from an recording tape, the shift register 10 shifts the position of serial data reproduced from the tape to late position every time the serial clock pulses SCLK being applied and the synchronous signal detector 20 detects the 16-bit synchronous signal SYNC1 from the shifted output Q1 to Q16 of the shift register 10.

The detection window controller 50 controls the synchronous signal SYNC1 to generate the synchronous signal SYNC2 as shown in FIG. 4(A) according to the window signals WIN1 and WIN2 from the counters 70 and 90.

The system controller 60 shown in FIG. 4 controls the counter 61 to change the output Q1, Q2 and Q3 every time the serial clock pulse being applied, which permits the NAND gate 62 to output low level signal when 7("111") is transmitted from the counter 61. If the synchronous signal SYNC2 transmitted from the OR gate 52 is at low level as shown in FIG. 5(A) or the counter 61 output becomes 7, the AND gate 65 clears the counter 61 by generating low level signal when the start signal START1 are maintained at high level as shown in FIG. 5(B).

The output signal of the AND gate 65 are the parallel load signal PLD as shown in FIG. 5(D). These clear operations are performed in 8-bit intervals. Further the parallel load signal PLD transmitted from the AND gate 65 is applied to the parallel shift register 40, which, in turn, latches the output Q1 to Q8 of the shift register 10 to generate 8-bit parallel data PDATA according to the parallel load signal PLD.

Meantime, the inverters 63A, 63B and 63C and the NAND gates 64A to 64D, connected to the output side of the counter 61, generate the parallel clock signal as shown in FIG. 5(C) which is "1" in case the counter 61 output Q1, Q2 and Q3 being 1("001"), 2("010"), 3("011") and 4("100") and, "0" in case the counter 61 output Q1, Q2, Q3 being 5("101"), 6("110"), 7("111"), 0("000"). For example, if the counter 61 output Q1, Q2, Q3 are "001", the output from the NAND gates 64A, 64B being "1" and the output from the NAND gate 64C being "0", the output from the NAND gate 64D will be "1" and if the counter 61 output Q1, Q2 and Q3 is "101", "1" being the output from all NAND gates 64A, 64B and 64C, "0" will be the output from the NAND gate 64D.

The D-flip-flop 66A, 66B, 66C generates synchronous signal SYNC3 of the parallel time as shown in FIG. 5(E) according to the output of the synchronous signal SYNC2, the serial clock signal SCLK and the NAND gate 62. These synchronous signal SYNC3 generate synchronous signal in case the synchronous patterns are disturbed.

The synchronous signal SYNC3, after being inverted in the inverter 67, causes to generate the start signal START2 in the D-flip-flop 68 as shown in FIG. 5(F).

In the first counter 70 in FIG. 3, the AND gate 71 generates the horizontal clock signal HCLK by the logical product of the start signal START2 and the clear signals CLR1, CLR2 feedback from the counters 72 and 92 and counter 72 generates the clear signal CLR1 in order to generate synchronous signal at the position where the synchronous signal should exist according to the horizontal clock signal HCLK and the parallel clock signal PCLK of the system controller 60 when the synchronous patterns should have been disturbed. Further, the first counter 70 generates detection window signal WIN1 in order to disregard those synchronous detection developed between synchronous signal and transmits the detection window signal WIN1 to one of the input terminals of the AND gate 51 of the detection window controller 50 in order to open detection windows at the two parallel clocks of 99 and 0.

In the second counter 90, the AND gate 91 generates the logical product of the start signal START2 of the system controller 60 and the clear signal CLR2 feedback from the counter 92, and the counter 92 generate detection window signal WIN2 and transmits it to other input terminal of the AND gate 51 in the detection window controller 50 in order to detect initial synchronous patterns correctly and to help next step signal process easier by detecting a preset number of synchronous signal from one track, in spite of the occurrence of errors and/or clock changes at the moment of heads alternation.

Figure 1:
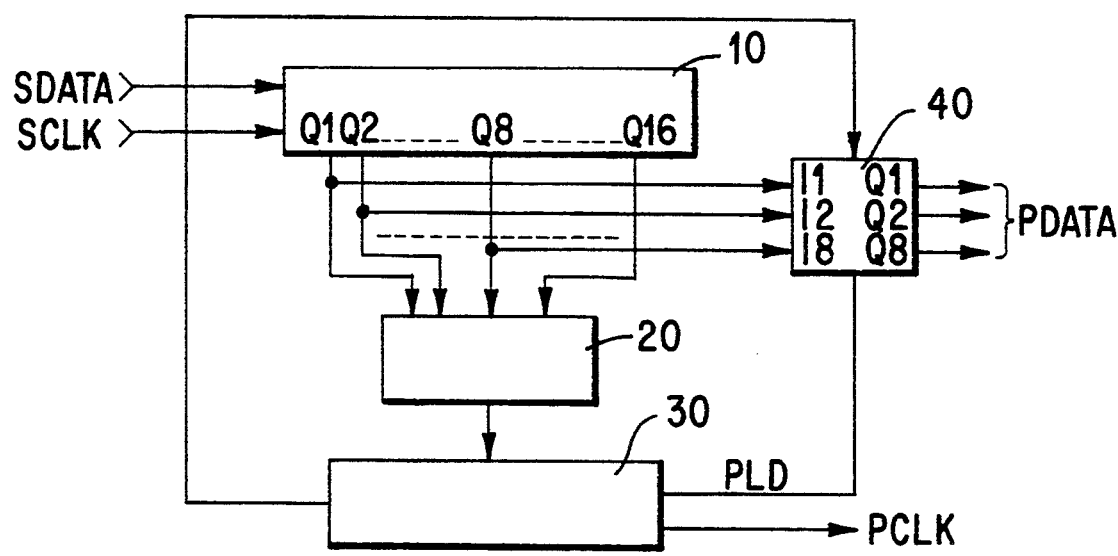
FIG. 1 shows a block diagram of a conventional device for converting data from series to parallel.
Figure 2A:
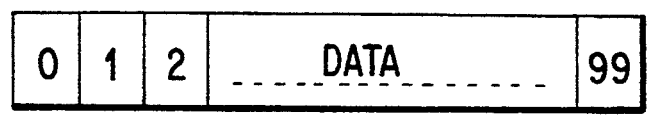
Figure 2B:
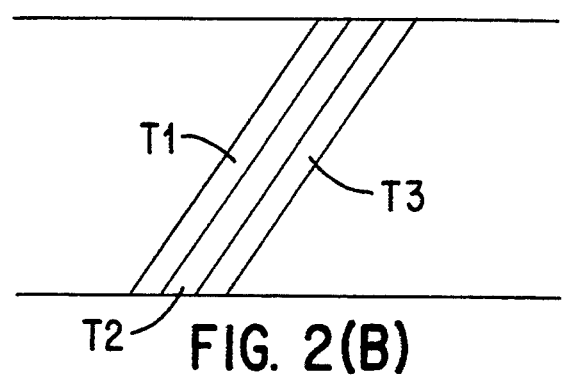
Figure 2C:
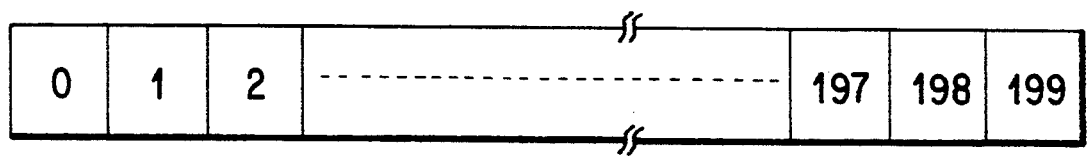

Whereas, if virtual data which are not factual data are applied to each two synchronous blocks at the start and end of a track, the development of errors at these parts of tracks where is susceptible to error development in very high probability when the heads alternate, can be avoided. (see FIG. 2(C)).

If it is supposed that the data disturbance happen only at the synchronous blocks of 0 and 199 even on the alternation of the heads, still it is possible to detect new synchronous signal from the synchronous signal detector by taking the synchronous signal at the third synchronous block as detection windows and as initial clocks for the counter 92 which clear counters 72, 92 of the value when the counter 92 counts 199.

This synchronous signal become the synchronous signal of the third synchronous block in next track, thus only 200 synchronous signal can be detected in one track.

As explained above, this invention permits, in conversion of serial data to parallel data, if the intervals between synchronous signal is not constant and/or the synchronous patterns are disturbed, to provide synchronous signal at the position where the synchronous signal should exist. Further, at the parts of head alternation, correct synchronous signal can be detected which permit to obtain original parallel data by providing virtual data which permit to detect synchronous signal through detection windows provided thereby. The device converting data from series to parallel in accordance with this invention can be of course applicable to all apparatuses which transmit, record and reproduce digital data.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A device for converting data from series to parallel, comprising:
    a shift register means for delaying serial data by a number of bits of a synchronous signal pattern in accordance with a serial clock and outputting an output signal, the serial data being reproduced from a magnetic recording medium;
    a detector means for detecting a synchronous signal from the output signal received from said shift register means;
    a system controller for generating a predetermined bits interval of a parallel load signal and a parallel clock signal
    a parallel shift register means for converting the output signal received from said shift register means to a predetermined bits interval of parallel data in accordance with the parallel load signal received from said system controller; and
    counter part means for counting the parallel clock signal generated by said system controller to generate window signals detecting the synchronous signal in a certain period when said detector means detects the synchronous signal,
    wherein said system controller means generates the parallel load signal responsive to the synchronous signal received from said detector means and the window signals received from said counter part means.

2. The device according to claim 1,
    wherein said detector means includes means for logical operating the window signals and the synchronous signal detected from the output signal of said shift register means to generate the synchronous signal in the certain period.

3. The device according to claim 2, wherein said system controller includes a first counter for counting the serial clock, means for operating an output signal of said first counter to produce a predetermined bits interval of parallel clock signal, a first AND gate for operating the detected synchronous signal in the certain period and a first start signal to produce a predetermined bits interval of parallel load signal, the parallel load signal clearing said first counter, a first delay means for delaying the synchronous signal for a predetermined time, and a second delay means for inverting and delaying an output signal of said first delay means to produce a second start signal for operating said counter part.

4. The device according to claim 3, further comprising a second AND gate for operating the output signal of said first delay means and the output signal of said counter part to produce a horizontal synchronous signal.

5. The device according to claim 3, wherein said counter part includes a second counter for producing a first window signal to detect the synchronous signal in a period of a first synchronous signal, and a third counter for producing a second window signal to detect the synchronous signal in a period of a second synchronous signal or a next synchronous signal.

6. The device according to claim 5, wherein said second counter is operated according to the second start signal and is cleared after counting a predetermined number of clock.

7. The device according to claim 5, wherein said third counter is operated according to the second start signal is cleared after counting a predetermined number of clock.

8. A device for converting serial data into parallel data, comprising:
    a synchronous signal detector detecting synchronous signals responsive to the serial data;
    means for generating a window signal representing an interval between the synchronous signals;
    means for generating windowed synchronous signals responsive to the synchronous signals and the window signal; and
    means for converting the serial data into the parallel data responsive to the windowed synchronous signals.

* * * * *